US006967481B2

(12) United States Patent
Chonan et al.

(10) Patent No.: US 6,967,481 B2
(45) Date of Patent: Nov. 22, 2005

(54) CIRCULAR POLE PIECE, LAMINATE BLOCK MANUFACTURING METHOD, AND MRI SYSTEM

(75) Inventors: Hiroyuki Chonan, Tokyo (JP); Takeshi Sako, Tokyo (JP); Yuji Inoue, Tokyo (JP); Masaaki Sakuma, Tokyo (JP)

(73) Assignees: GE Medical Systems Global Technology Company, LLC, Waukesha, WI (US); Denkishizai Company, Limited, Tokyo (JP)

( * ) Notice: Subject to any disclaimer, the term of this patent is extended or adjusted under 35 U.S.C. 154(b) by 0 days.

(21) Appl. No.: 10/776,879

(22) Filed: Feb. 11, 2004

(65) Prior Publication Data

US 2004/0160222 A1 Aug. 19, 2004

(30) Foreign Application Priority Data

Feb. 12, 2003 (JP) ............................ 2003-033990
Nov. 11, 2003 (JP) ............................ 2003-380839

(51) Int. Cl.[7] ................................................ G01V 3/00
(52) U.S. Cl. ....................... 324/319; 324/320; 335/216
(58) Field of Search ................................ 324/319, 320, 324/321, 318; 335/216, 296, 297, 306

(56) References Cited

U.S. PATENT DOCUMENTS

| | | | |
|---|---|---|---|
| 4,753,822 A | 6/1988 | Van Mensvoort | |
| 5,317,297 A | 5/1994 | Kaufman et al. | |
| 5,631,616 A | 5/1997 | Ohta et al. | |
| 5,680,086 A | 10/1997 | Allis et al. | |
| 6,127,825 A | 10/2000 | Goto | |
| 6,150,819 A | 11/2000 | Laskaris et al. | |
| 6,218,834 B1 | 4/2001 | Goto | |
| 6,662,434 B2 | 12/2003 | Laskaris et al. | |
| 6,838,966 B2 * | 1/2005 | Inoue | 335/297 |
| 2002/0171526 A1 | 11/2002 | Laskaris et al. | |

FOREIGN PATENT DOCUMENTS

| | | | |
|---|---|---|---|
| EP | 0691548 | A | 1/1996 |
| EP | 1004888 | A | 5/2000 |
| GB | 1 415 209 | A | 11/1975 |
| JP | 2000-185023 | | 7/2000 |
| JP | 2000-200716 | | 7/2000 |

OTHER PUBLICATIONS

International Search Report, dated Jun. 16, 2004, Application No. EP 04 25 0742, 3 pages.

* cited by examiner

*Primary Examiner*—Louis Arana
(74) *Attorney, Agent, or Firm*—Carl B. Horton, Esq.; Armstrong Teasdale LLP

(57) ABSTRACT

Provided is a circular pole piece that contributes to simplification of work and a reduction in costs and that has no gap created among adjoining blocks. A circular pole piece is manufactured by circularly arranging laminate blocks each having numerous hexagonal directional magnetic steel sheet tiles layered. Since heteromorphic soft magnetic material tiles are unnecessary, work can be simplified and the cost of the circular pole piece can be reduced. Moreover, the laminate blocks can be arranged substantially circularly without a gap among adjoining blocks.

11 Claims, 6 Drawing Sheets

CIRCULAR POLE PIECE, LAMINATE BLOCK MANUFACTURING METHOD, AND MRI SYSTEM

CROSS REFERENCE TO RELATED APPLICATIONS

This application claims the benefit of Japanese Application No. 2003-033990 filed Feb. 12, 2003, and Japanese Application No. 2003-380839 filed Nov. 11, 2003.

BACKGROUND OF THE INVENTION

The present invention relates to a circular pole piece included in a magnetic circuit for magnetic resonance imaging (MRI), a method of manufacturing a laminate block employed in the circular pole piece, and an MRI system employing the circular pole piece.

In the past, a circular pole piece included in a magnetic circuit for MRI has been shaped substantially circularly as a whole by arranging laminate blocks each of which has square or rectangular soft magnetic material tiles or heteromorphic soft magnetic material tiles, each of which is used to fill a gap among adjoining square or rectangular tiles, layered (see, for example, FIG. 1 in Patent Document 1). Otherwise, the circular pole piece has been shaped substantially circularly as a whole by arranging laminate blocks, each of which has trapezoidal or annularly sectoral soft magnetic material tiles layered, in the form of multiple concentric rings (see, for example, FIG. 21 in the Patent Document 1).

[Patent Document 1]

Japanese Unexamined Patent Publication No. 2000-200716

Laminate blocks each having square or rectangular soft magnetic material tiles or heteromorphic soft magnetic material tiles, each of which is used to fill a gap among adjoining square or rectangular tiles, layered may be arranged to form a substantially circular pole piece. In this case, since the heteromorphic soft magnetic material tiles must be arranged, the work is complex and the cost of the pole piece is high.

On the other hand, laminate blocks each having trapezoidal or annularly sectoral soft magnetic material tiles layered may be arranged in the form of multiple concentric rings in order to produce a substantially circular pole piece. In this case, there is a gap between adjoining rings or adjoining laminate blocks included in one ring. Moreover, in order to eliminate such a gap, trapezoidal or annularly sectoral soft magnetic material tiles of different sizes must be arranged. This leads to complex work and a high cost.

BRIEF DESCRIPTION OF THE INVENTION

An object of the present invention is to provide a circular pole piece that contributes to simplification of work and a reduction in costs and that has no gap among adjoining laminate blocks, a method of manufacturing a laminate block employed in the circular pole piece, and an MRI system employing the circular pole piece.

According to the first aspect of the present invention, there is provided a circular pole piece that is included in a magnetic circuit for MRI. The circular pole piece is shaped substantially circularly by arranging laminate blocks each of which has hexagonal soft magnetic material tiles layered.

In the circular pole piece in accordance with the first aspect, the soft magnetic material tiles are hexagonal. Therefore, the laminate blocks each having the soft magnetic material tiles layered can be arranged substantially circularly without a gap among adjoining blocks. Moreover, since a plurality of heteromorphic soft magnetic material tiles is unnecessary, work can be simplified and the cost of the circular pole piece can be reduced.

According to the second aspect of the present invention, there is provided a circular pole piece having the same structure as the foregoing one. Herein, hexagonal directional magnetic steel sheet tiles that are identical to one another are layered with the directions of the axes of easy magnetization thereof varied by 60° so that they will have a non-directional property as a whole.

The circular pope piece in accordance with the second aspect employs directional magnetic steel sheet tiles that exhibit a high permeability. This contributes to minimization of a residual magnetic induction. Moreover, the directional magnetic steel sheet tiles are layered with the directions of the axes of easy magnetization thereof varied by 60° so that they will have a non-directional property as a whole. A residual magnetic induction caused by switching of external magnetic fields can therefore be minimized irrespective of the direction of an external magnetic field (especially, the direction of a magnetic field gradient).

According to the third aspect of the present invention, a circular pole piece has the same structure as the aforesaid ones. Herein, the laminate block has identical hexagonal directional magnetic steel sheet tiles layered with the directions of the axes of easy magnetization thereof varied by 60° so that the tiles will exhibit a non-directional property as a whole, and has a non-directional magnetic steel sheet tile, which is devoid of an axis of easy magnetization, layered in combination with the directional magnetic steel sheet tiles.

The circular pole piece in accordance with the third aspect employs the directional magnetic steel sheet tiles exhibiting a high permeability. This results in a minimized residual magnetic induction. Moreover, the directional magnetic steel sheets are layered with the directions of the axes of easy magnetization thereof varied by 60° so that they will exhibit a non-directional property. Therefore, the residual magnetic induction can be minimized irrespective of the direction of an external magnetic field (especially, the direction of a magnetic field gradient). Furthermore, the non-directional magnetic steel sheet tile whose permeability is lower than that of the directional magnetic steel sheet tiles but which is inexpensive is layered in combination (in order to adjust the height of a laminate block). This results in the reduced cost of the circular pole piece.

According to the fourth aspect of the present invention, the circular pole piece has the same structure as the aforesaid ones. Herein, the laminate block has non-directional magnetic steel sheet tiles devoid of an axis of easy magnetization layered.

The circular pole piece in accordance with the fourth aspect employs the inexpensive non-directional magnetic steel sheet tiles. Consequently, the cost of the circular pole piece can be reduced.

According to the fifth aspect of the present invention, a circular pole piece has the same structure. Herein, one side of a soft magnetic material tile is approximately 2.5 cm or less in length.

In the circular pole piece in accordance with the fifth aspect, the maximum diameter of a soft magnetic material tile is approximately 5 cm or less. This is advantageous because the adverse effect of an eddy current derived from a magnetic field gradient can be suppressed.

According to the sixth aspect of the present invention, a directional magnetic steel sheet having an axis of easy magnetization is hexagonally cut using a die in order to produce directional magnetic steel sheet tiles. A plurality of directional magnetic steel sheet tiles is layered with the axes of easy magnetization thereof turned by 60° so that the tiles will exhibit a non-directional property as a whole. The tiles are then integrated using an adhesive, through caulking, or using a rivet or screw.

According to the sixth aspect, a laminate block to be employed in the circular pole piece in accordance with the second embodiment can be manufactured preferably.

According to the seventh aspect of the present invention, a directional magnetic steel sheet having an axis of easy magnetization is hexagonally cut using a die in order to produce directional magnetic steel sheet tiles. A non-directional steel sheet devoid of an axis of easy magnetization is hexagonally cut using a die in order to produce non-directional magnetic steel sheet tiles. A plurality of directional magnetic steel sheet tiles is layered with the axes of easy magnetization thereof turned by 60° so that the tiles will exhibit a non-directional property as a whole. Moreover, the non-directional magnetic steel sheet tile is layered in combination with the directional magnetic steel sheet tiles. The resultant combination of directional magnetic steel sheet tiles and non-directional magnetic steel sheet tiles is integrated using an adhesive, through caulking, or using a rivet or screw.

According to the seventh aspect, the laminate block employed in the circular pole piece in accordance with the third aspect can be manufactured preferably.

According to the eighth aspect of the present invention, there is provided a laminate block manufacturing method. Herein, a non-directional magnetic steel sheet devoid of an axis of easy magnetization is hexagonally cut using a die in order to produce non-directional magnetic steel sheet tiles. A plurality of non-directional magnetic steel sheet tiles is layered, and integrated using an adhesive, through caulking, or using a rivet or screw.

According to the eighth aspect, the laminate block employed in the circular pole piece in accordance with the fourth aspect can be manufactured preferably.

According to the ninth aspect of the present invention, there is provided an MRI system including a circular pole piece that has the same structure as the aforesaid ones.

In the MRI system in accordance with the ninth aspect, laminate blocks each having hexagonal soft magnetic material tiles layered can be arranged substantially circularly without a gap among adjoining blocks. Since heteromorphic soft magnetic material tiles are unnecessary, work can be simplified. Eventually, the cost of the circular pole piece can be reduced.

According to a circular pole piece and an MRI system in which the present invention is implemented, heteromorphic soft magnetic material tiles are unnecessary. Therefore, work can be simplified and the cost of the circular pole piece can be reduced. Moreover, laminate blocks can be arranged substantially circularly without a gap among adjoining blocks.

Moreover, according to a laminate block manufacturing method in which the present invention is implemented, a laminate block employed in the circular pole piece in accordance with the present invention can be manufactured preferably.

Further objects and advantages of the present invention will be apparent from the following description of the preferred embodiments of the invention as illustrated in the accompanying drawings.

BRIEF DESCRIPTION OF THE DRAWINGS

FIG. 10 is viewed from side direction.

DETAILED DESCRIPTION OF THE INVENTION

The present invention will be detailed in relation to illustrated embodiments below.

First Embodiment

Figure 1:
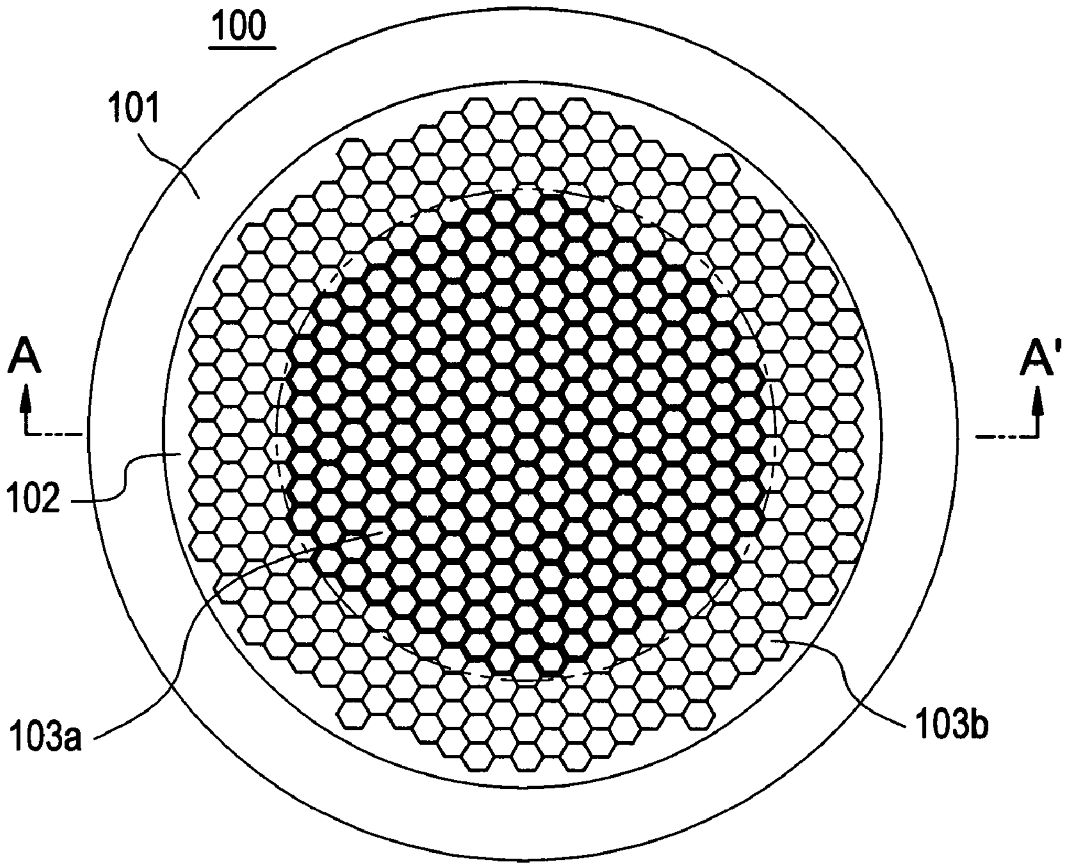
FIG. 1 is a plan view showing a circular pole piece in accordance with a first embodiment of the present invention.
Figure 2:
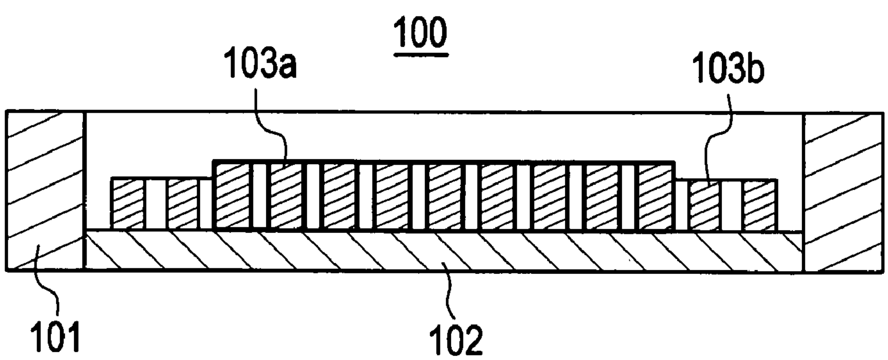
FIG. 2 is an A–A' sectional view of the circular pole piece shown in FIG. 1.

FIG. 1 is a plan view showing a circular pole piece 100 in accordance with a first embodiment. FIG. 2 is an A–A' sectional view of the circular pole piece shown in FIG. 1.

The circular pole piece 100 comprises a ring 101, a disk-like base 102 disposed inside the ring 101 and made of a carbon steel, center-portion laminate blocks **103*a* arranged substantially circularly on the center portion of the base 102, and marginal-portion laminate blocks 103*b* arranged like a doughnut on the marginal portion of the base 102**.

The height of the center-portion laminate blocks **103*a* is, for example, 42 mm, and the height of the marginal-portion laminate blocks 103** is, for example, 36 mm.

Both the center-portion laminate block **103*a* and marginal-portion laminate block 103*b* have a structure that hexagonal soft magnetic material tiles are layered. When the laminate structure is described, the center-portion laminate block 103*a* and marginal-portion laminate block 103*b* will not be discriminated from each other but will be called generically a laminate block 103**.

Figure 3:
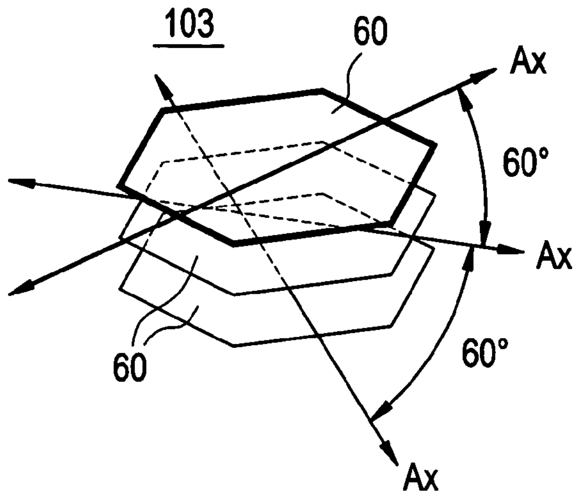
FIG. 3 is a perspective view showing a first example of the laminate structure of a laminate block in accordance with the first embodiment.

FIG. 3 is an explanatory diagram showing a first example of the laminate structure of the laminate block 103.

The laminate block 103 is manufactured by repeatedly layering three hexagonal directional magnetic steel sheet tiles 60, each side of which has a length of 2.5 cm, with the directions of the axes of easy magnetization Ax thereof varied by 60° so that the tiles will exhibit a non-directional property as a whole. Incidentally, one side of the hexagonal directional magnetic steel sheet tile may have a length of 2.5 cm or less.

The thickness of the directional magnetic steel sheet tile 60 is, for example, 0.35 mm. The center-portion laminate block 103*a* has 120 directional magnetic steel sheet tiles 60 layered, while the marginal-portion laminate block 103*b* has 102 directional magnetic steel sheet tiles 60 layered.

Figure 4:
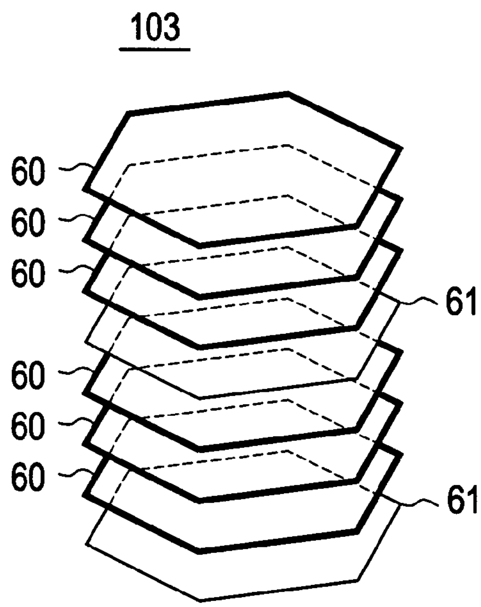
FIG. 4 is a perspective view showing a second example of the laminate structure of the laminate block in accordance with the first embodiment.

FIG. 4 is an explanatory diagram showing a second example of the laminate structure of the laminate block 103.

The laminate block 103 is manufactured by layering three hexagonal directional magnetic steel sheet tiles 60, each side of which has a length of 2.5 cm, with the directions of the axes of easy magnetization Ax thereof varied by 60°. Thereafter, one non-directional magnetic steel sheet tile 61 having the same shape as the directional magnetic steel sheet tiles 60 is layered in combination with the three directional magnetic steel sheet tiles. This process is repeated so that the laminate block will exhibit a non-directional property as a whole.

The thickness of the directional magnetic steel sheet tile 60 and non-directional magnetic steel sheet tile 61 is, for example, 0.35 mm. Therefore, the center-portion laminate block 103*a* has 82 directional magnetic steel sheet tiles 60 and 27 non-directional magnetic steel sheet tiles 61 layered. The marginal-portion laminate block 103*b* has 77 directional magnetic steel sheet tiles 60 and 25 non-directional magnetic steel sheet tiles 61 layered.

Figure 5:
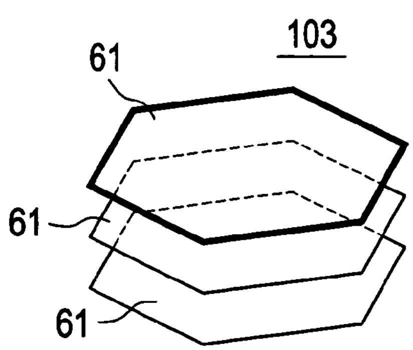
FIG. 5 is a perspective view showing a second example of the laminate structure of the laminate block in accordance with the first embodiment.

FIG. 5 is an explanatory diagram showing a third example of the laminate structure of the laminate block 103.

The laminate block 103 is manufactured by layering hexagonal non-directional magnetic steel sheet tiles 61 each side of which has a length of 2.5 cm.

The thickness of the non-directional magnetic steel sheet tile 61 is, for example, 0.35 mm. Therefore, the center-portion laminate block 103*a* has 120 non-directional magnetic steel sheet tiles 61 layered, while the marginal-portion laminate block 103*b* has 102 non-directional magnetic steel sheet tiles 61 layered.

The laminate block 103 having the laminate structure shown in FIG. 3 is manufactured as described below.

Figure 6:
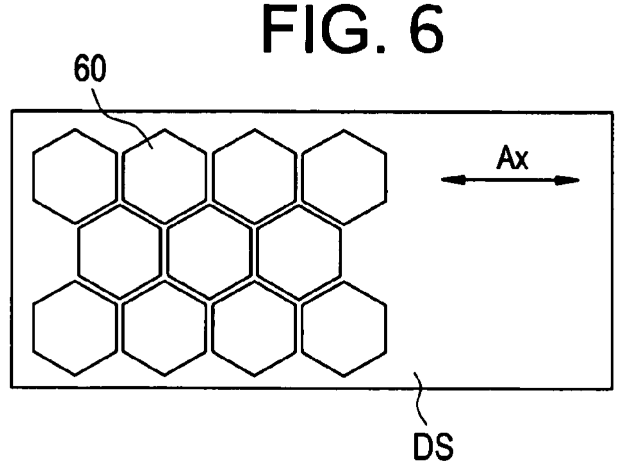
FIG. 6 is an explanatory diagram showing a method of manufacturing directional magnetic steel sheet tiles.

First, as shown in FIG. 6, a directional magnetic steel sheet DS is cut using a die in order to produce numerous directional magnetic steel sheet tiles 60. If degradation in a magnetic property caused by strain deriving from die cutting cannot be ignored, straightening annealing is carried out.

Thereafter, as shown in FIG. 3, a required number of directional magnetic steel sheet tiles 60 is layered through internal-die caulking or the like in order to produce the laminate block 103.

After the laminate block 103 is immersed in an adhesive solution L, the laminate block 103 is hardened and integrated so that it will not be disunited with application of electromagnetic force.

The laminate block 103 having the laminate structure shown in FIG. 4 is manufactured as described below.

First, as shown in FIG. 6, a directional magnetic steel sheet DS is cut using a die in order to produce numerous directional magnetic steel sheet tiles 60. If degradation in a magnetic property caused by strain deriving from die cutting cannot be ignored, straightening annealing is carried out.

Figure 8:
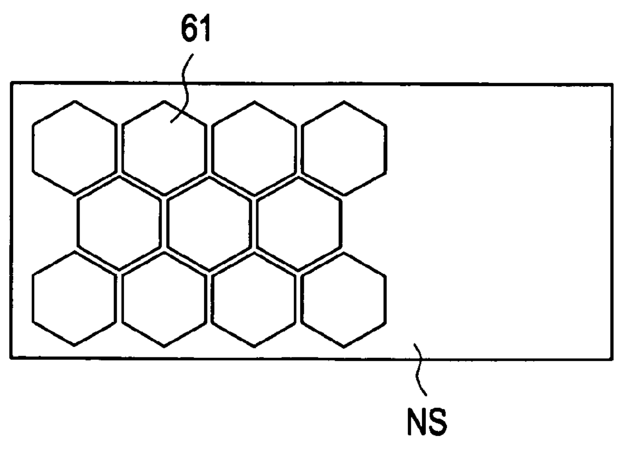
FIG. 8 is an explanatory diagram showing a method of manufacturing non-directional magnetic steel sheet tiles.

Thereafter, as shown in FIG. 8, a non-directional magnetic steel sheet NS is cut using a die in order to produce numerous non-directional magnetic steel sheet tiles 61.

Thereafter, as shown in FIG. 4, a required number of directional magnetic steel sheet tiles 60 and a required number of non-directional magnetic steel sheet tiles 61 are layered in order to produce the laminate block 103.

Figure 7:
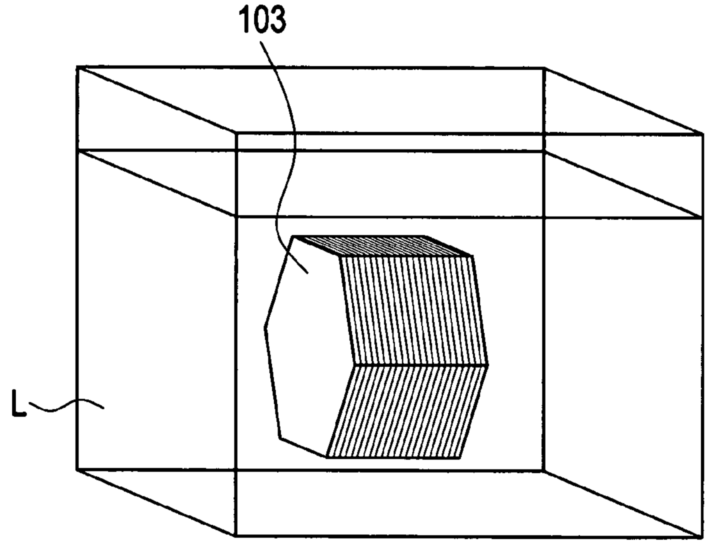
FIG. 7 is an explanatory diagram showing integration of a laminate block through bonding.

Thereafter, as shown in FIG. 7, the laminate block 103 is immersed in an adhesive solution L, and then hardened and integrated.

The laminate block 103 having the laminate structure shown in FIG. 5 is manufactured as described below.

First, as shown in FIG. 8, a non-directional magnetic steel sheet NS is cut using a die in order to produce numerous non-directional magnetic steel sheet tiles 61.

Thereafter, as shown in FIG. 5, a required number of non-directional magnetic steel sheet tiles 61 are layered in order to produce the laminate block 103.

Thereafter, as shown in FIG. 7, the laminate block 103 is immersed in an adhesive solution L, and then hardened and integrated.

According to the foregoing circular pole piece 100, since heteromorphic soft magnetic material tiles are unnecessary, work can be simplified and the cost of the circular pole piece can be reduced. Moreover, the laminate blocks 103 can be arranged substantially circularly without a gap among adjoining blocks. Furthermore, since the maximum length of the laminate block 103 is 5 cm, the adverse effect of an eddy current deriving from a magnetic field gradient can be minimized.

Figure 10:
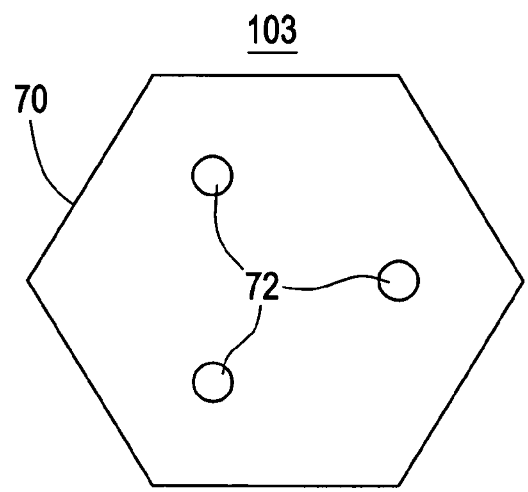
FIG. 10 is a top view showing a laminate block that is integrated with four magnetic steel sheet tiles through caulking.
Figure 11:
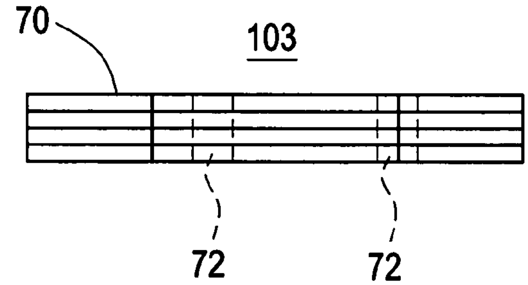
FIG. 11 is a side view showing the laminate block of FIG. 10.
Figure 12:
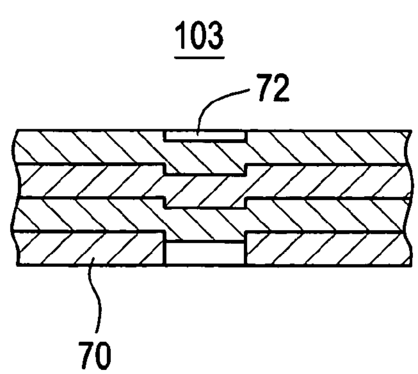
FIG. 12 is an expanded sectional view of the caulking when

FIG. 10 is a top view showing a laminate block 103 which has four layered magnetic steel sheet tiles 70 (directional magnetic steel sheet tiles 60 or non-directional magnetic steel sheet tiles 61) and which is integrated through caulking. FIG. 11 is a side view showing the laminate block 103. FIG. 12 is an expanded sectional view showing a caulking point 72 when the laminate block 103 is viewed from side direction. As shown in FIGS. 10 through 12, the four layered magnetic steel sheet tiles 70 have three caulking points 72 that are symmetrical to the center of the magnetic steel sheet tile 70, and they are integrated through caulking.

Incidentally, though FIGS. 10 through 12 are an example of three caulking points 72, caulking points that are symmetrical to the center of the magnetic steel sheet tile 70 may be six, twelve etc.

Figure 13:
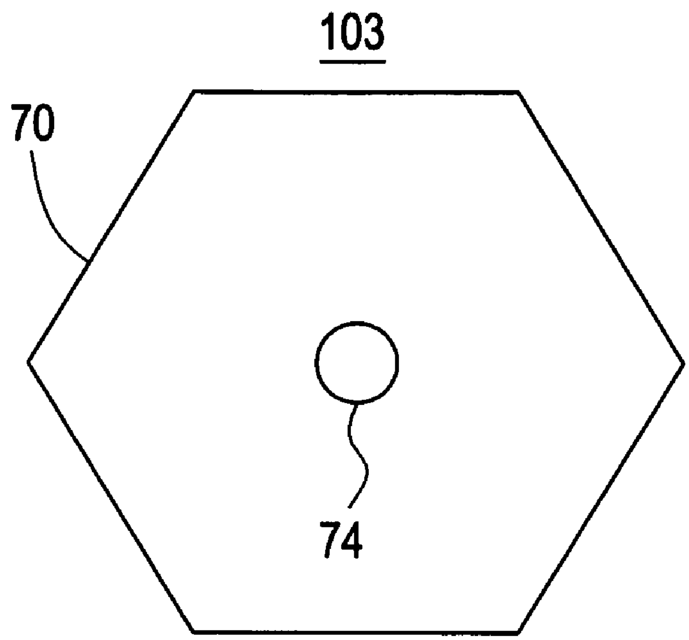
FIG. 13 is a top view showing a laminate block that is integrated with four magnetic steel sheet tiles through using a rivet or a screw.
Figure 14:
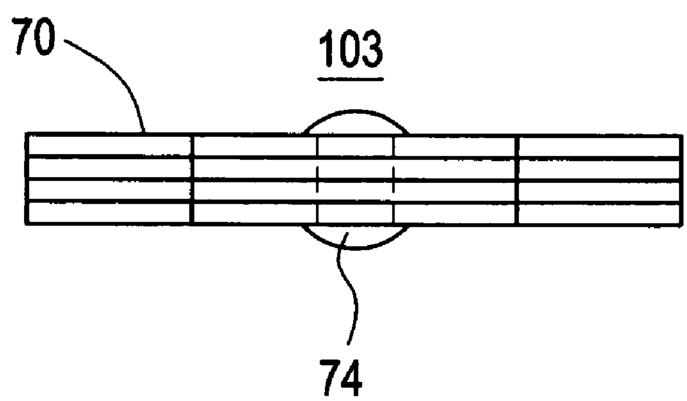
FIG. 14 is a side view showing the laminate block of FIG. 13.

FIG. 13 is a top view showing a laminate block 103 which has four layered magnetic steel sheet tiles 70 and which is integrated through using a rivet 74 or a screw 74. FIG. 14 is a side view showing the laminate block 103. As shown in FIGS. 13 and 14, the rivet 74 or the screw 74 pierces the four layered magnetic steel sheet tiles 70 and holds them. The four layered magnetic steel sheet tiles 70 are integrated through using the rivet 74 or the screw 74.

Incidentally, though FIGS. 13 and 14 are an example of using a rivet 74 or a screw 74, rivets or screws that are placed symmetrical to the center of the magnetic steel sheet tile 70 may be three, six, twelve pieces etc.

Second Embodiment

Figure 9:
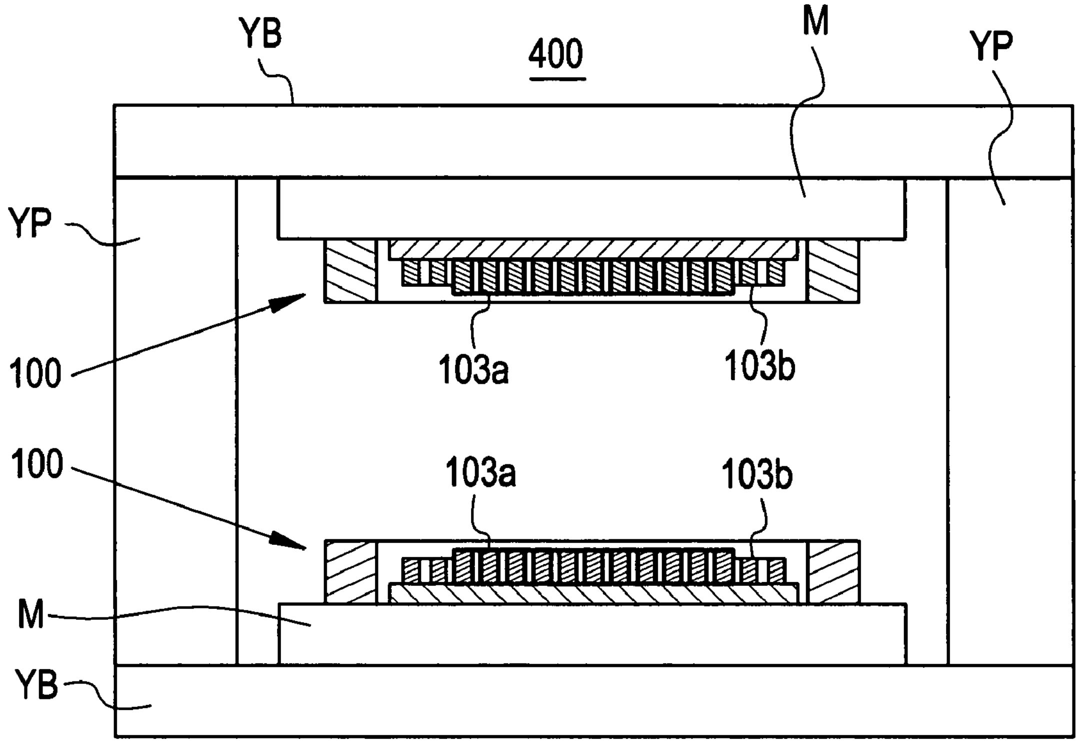
FIG. 9 is a front view showing the major part of an MRI system in accordance with a second embodiment.

FIG. 9 is a sectional view showing the major part of an MRI system in accordance with a second embodiment.

An MRI system 400 is an open MRI system. Herein, a magnetic circuit comprising permanent magnets M vertically opposed to each other, base yokes YB, support yokes YP, and circular pole pieces 100 is used to induce a static magnetic field in a vertical direction between the circular pole pieces 100.

Other Embodiments

Instead of a magnetic steel sheet, a silicon steel sheet, a ferrite, an amorphous soft magnetic material, or any other soft magnetic material may be adopted.

Many widely different embodiments of the invention may be configured without departing from the spirit and the scope of the present invention. It should be understood that the present invention is not limited to the specific embodiments described in the specification, except as defined in the appended claim.

What is claimed is:

1. A circular pole piece included in a magnetic circuit for magnetic resonance imaging (MRI), wherein laminate blocks each of which has hexagonal soft magnetic material tiles layered are arranged so that the blocks will have a substantially circular shape as a whole.

2. A circular pole piece according to claim 1, wherein said laminate block has hexagonal directional magnetic steel sheet tiles, which are identical to one another, layered with the directions of the axes of easy magnetization thereof varied by 60° so that the tiles will exhibit a non-directional property as a whole.

3. A circular pole piece according to claim 1, wherein said laminate block has hexagonal directional magnetic steel sheet tiles, which are identical to one another, layered with the directions of the axes of easy magnetization thereof varied by 60° so that the tiles will exhibit a non-directional property as a whole, and has a non-directional magnetic steel sheet tile, which is devoid of an axis of easy magnetization, layered in combination with the directional magnetic steel sheet tiles.

4. A circular pole piece according to claim 1, wherein said laminate block has non-directional magnetic steel sheet tiles, which are devoid of an axis of easy magnetization, layered.

5. A circular pole piece according to claim 1, wherein one side of said soft magnetic material tile is approximately 2.5 cm or less in length.

6. A circular pole piece according to claim 1 wherein the circular pole piece is different from a permanent magnet.

7. A circular pole piece according to claim 1 wherein the circular pole piece is different from a permanent magnet of a magnetic resonance imaging system implementing the magnetic resonance imaging.

8. A laminate block manufacturing method comprising the steps of:

hexagonally cutting a directional magnetic steel sheet, which has an axis of easy magnetization, using a die so as to produce directional magnetic steel sheet tiles of a pole piece; layering the directional magnetic steel sheet tiles with the axes of easy magnetization thereof turned by 60° so that the tiles will exhibit a non-directional property as a whole; and integrating the tiles using an adhesive, through caulking, or using a rivet or screw.

9. A laminate block manufacturing method comprising the steps of:

hexagonally cutting a directional magnetic steel sheet, which has an axis of easy magnetization, using a die so as to produce directional magnetic steel sheet tiles of a pole piece;

hexagonally cutting a non-directional magnetic steel sheet, which is devoid of an axis of easy magnetization, using a die so as to produce non-directional magnetic steel sheet tiles of the pole piece;

layering the directional magnetic steel sheet tiles with the axes of easy magnetization thereof turned by 60° so that the directional magnetic steel sheet tiles will exhibit a non-directional property as a whole, and layering at least one of the non-directional magnetic steel sheet tiles in combination with the directional magnetic steel tiles; and integrating the directional magnetic steel sheet tiles and at least one of the non-directional magnetic steel sheet tiles using an adhesive, through caulking, or using a rivet or screw.

10. A laminate block manufacturing method comprising the steps of:

hexagonally cutting a non-directional magnetic steel sheet devoid of an axis of easy magnetization using a die so as to produce non-directional magnetic steel sheet tiles of a pole piece;

layering the non-directional magnetic steel sheet tiles; and integrating the tiles using an adhesive, through caulking, or using a rivet or screw.

11. An MRI system comprising:

a circular pole piece comprising a plurality of laminate blocks arranged so that the laminate blocks will have a substantially circular shape as a whole, and wherein each laminate block comprises a plurality of hexagonal soft magnetic material tiles.

* * * * *